United States Patent
Nakagawa

(10) Patent No.: US 8,419,962 B2
(45) Date of Patent: Apr. 16, 2013

(54) METHOD FOR DISPOSING A MICROSTRUCTURE

(75) Inventor: Tohru Nakagawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/191,876

(22) Filed: Jul. 27, 2011

(65) Prior Publication Data

US 2011/0277917 A1    Nov. 17, 2011

Related U.S. Application Data

(63) Continuation of application No. PCT/JP2011/001588, filed on Mar. 17, 2011.

(30) Foreign Application Priority Data

Mar. 19, 2010  (JP) .................................. 2010-063792

(51) Int. Cl.
*C03C 15/00*    (2006.01)

(52) U.S. Cl.
USPC ................... 216/86; 216/33; 216/36; 438/753

(58) Field of Classification Search ................... 438/441, 438/442, 745, 750, 751, 753; 216/83, 86, 216/33, 36

See application file for complete search history.

(56) References Cited

U.S. PATENT DOCUMENTS

| | | | |
|---|---|---|---|
| 5,545,291 A | 8/1996 | Smith et al. | |
| 5,824,186 A | 10/1998 | Smith et al. | |
| 6,527,964 B1 | 3/2003 | Smith et al. | |
| 7,288,178 B2 * | 10/2007 | Cohen et al. | 205/118 |
| 7,321,159 B2 * | 1/2008 | Schatz | 257/622 |
| 2001/0031514 A1 * | 10/2001 | Smith | 438/107 |
| 2006/0051517 A1 | 3/2006 | Haas et al. | |
| 2006/0057293 A1 | 3/2006 | Sharma et al. | |
| 2009/0053855 A1 * | 2/2009 | Summers | 438/112 |

FOREIGN PATENT DOCUMENTS

| | | |
|---|---|---|
| JP | 09-120943 | 5/1997 |
| JP | 2000-051733 | 2/2000 |
| JP | 2006-245067 | 9/2006 |

OTHER PUBLICATIONS

Barry, C.R., et al., "Approaching Programmable Self-Assembly from Nanoparticle-Based Devices to Intergrated Circuits", Proceedings of the Foundations of Nanoscience, Apr. 21-23, 2004, Utah USA.
Yeh, H-J J., et al., "Fluidic Self-Assembly for the Integration of GaAs Light-Emitting Diodes on Si Substrates", IEEE Photonics Technology Letters, Jun. 1994, pp. 706-708, vol. 6 No. 6, IEEE.
Drobac, S., "Fluidic Self-Assembly Could Change the Way FPDs Are Made", Information Display, 1999, pp. 12-16, vol. 11/99.

* cited by examiner

*Primary Examiner* — Lan Vinh
(74) *Attorney, Agent, or Firm* — McDermott Will & Emery LLP

(57) ABSTRACT

A method of the present invention comprises: preparing the first substrate comprising a surface with a first recess and a second recess of which a bottom comprises a first electrode; immersing the first substrate into a electrolyte solution; inserting a second electrode into the electrolyte solution; injecting a bubble into the electrolyte solution with applying a voltage between the first and the second electrodes to dispose the bubble onto only the first recess; dispersing the first microstructure into the electrolyte solution to dispose it onto the first recess; injecting the bubble into the electrolyte solution to dispose the bubble onto the second recess; and dispersing the second microstructure into the electrolyte solution to dispose it onto the second recess.

5 Claims, 16 Drawing Sheets

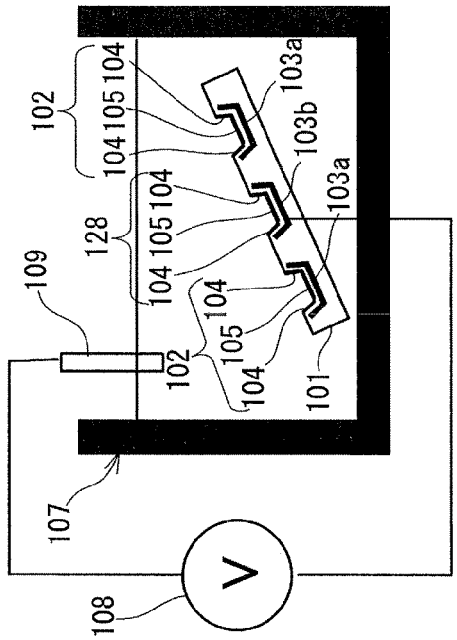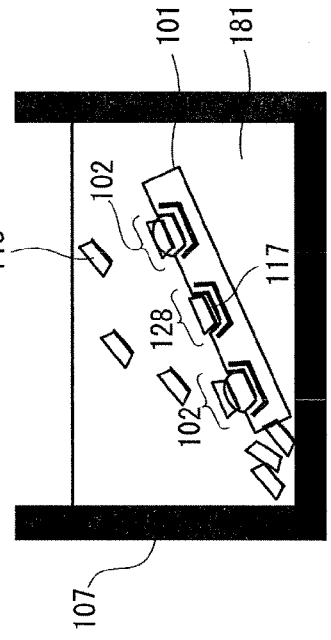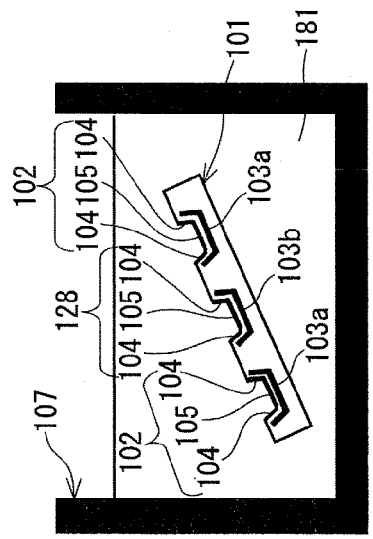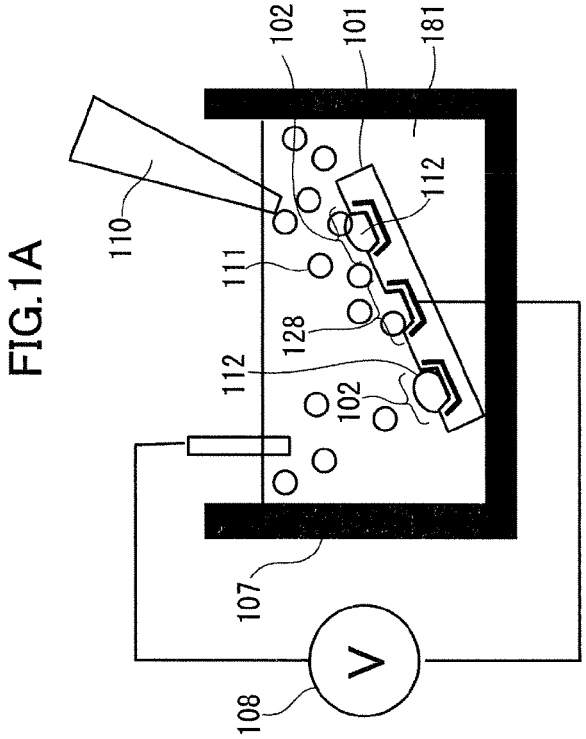

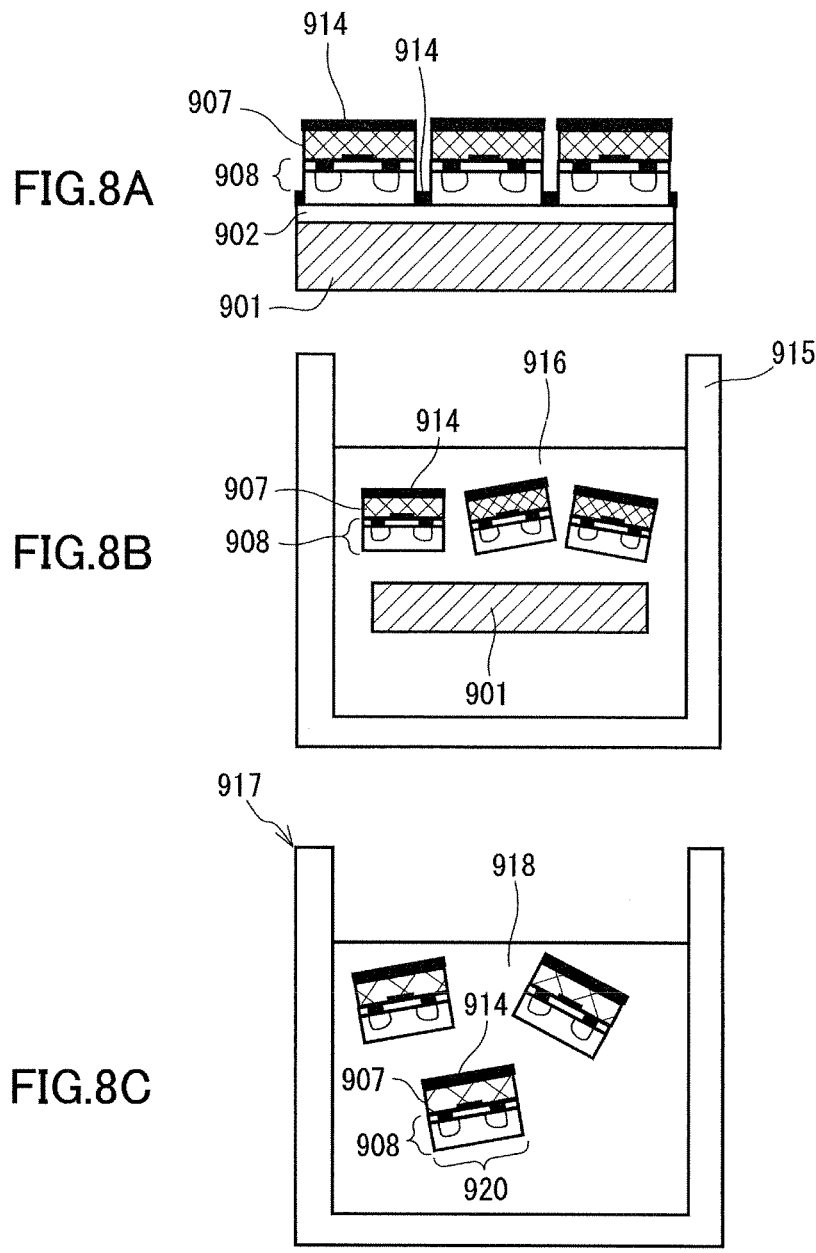

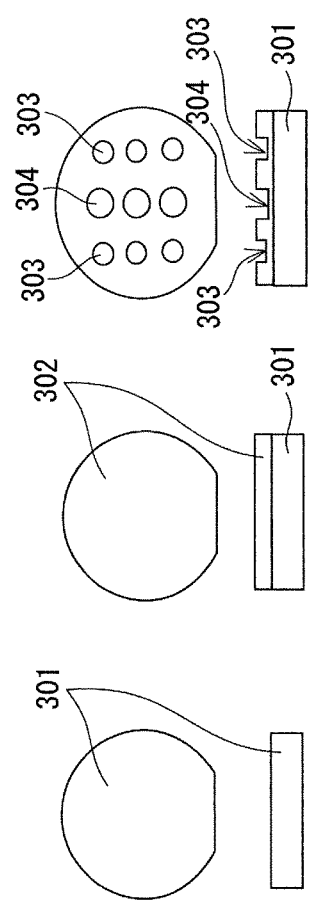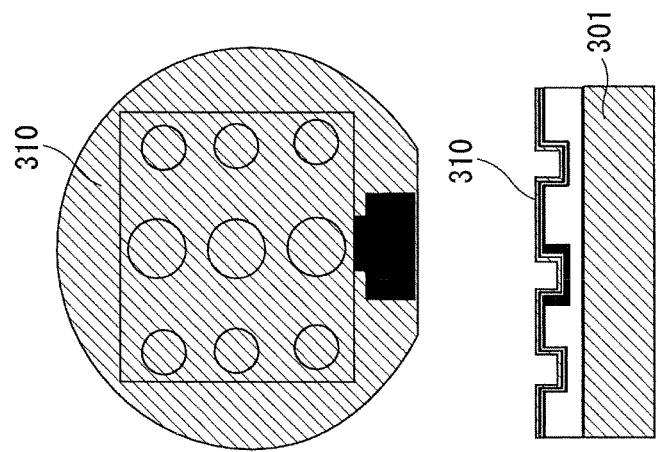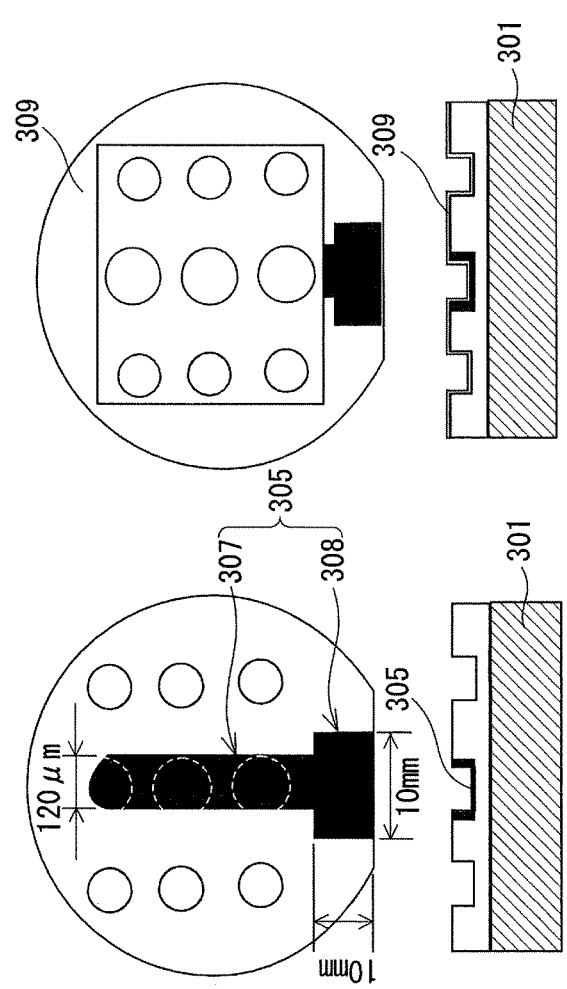

METHOD FOR DISPOSING A MICROSTRUCTURE

This Application is a continuation of International Application No. PCT/JP2011/001588, whose international filing date is Mar. 17, 2011 which in turn claims the benefit of Japanese Patent Application No. 2010-063792, filed on Mar. 19, 2010, the disclosures of which Applications are incorporated by reference herein. The benefit of the filing and priority dates of the International and Japanese Applications is respectfully requested.

BACKGROUND OF THE INVENTION

1. Field of the Invention

The present disclosure relates to a method for disposing a microstructure.

2. Description of Related Art

In a typical mounting device, an electric element is grasped and the electric element is mounted on a substrate. Due to downsizing of electric devices, the mounting device is required to grasp a smaller electric element.

However, such a small electric element may be destroyed by small external force. Accordingly, the minimum size of the side length of the electric element which can be mounted with the typical mounting device is approximately 0.2 millimeters.

In order to solve this problem, Patent Literature 1 (U.S. Pat. No. 5,545,291), Patent Literature 2 (Japanese Laid-Open Patent Publication No. Hei 9-120943), and Non-patent Literature 1 (Yeh H.-J. and Smith J. S., IEEE Photonics Technology Letters 6 (1994) 706) disclose methods for disposing electric microelements with use of liquid.

Particularly, Patent Literature 1 and Non-patent Literature 1 disclose methods for disposing GaAs laser diode elements on a substrate. The GaAs laser diode element comprises a side with a length of 20 micrometers.

The methods in the Patent Literature 1 and Non-patent Literature 1 comprise the following steps.

First, the substrate having recesses to which the elements are to be mounted on its surface is formed. The recesses have identical shapes to these of the elements.

Next, the elements to be disposed are dispersed in a liquid such as methanol to prepare a dispersion liquid.

And, the substrate is subjected to the dispersion liquid. Because the recesses have identical shapes to these of the elements, the elements are disposed on the recesses.

Non-patent Literature 2 (Drobac S., Information Display, 11/19 (1999)12) discloses a method for disposing a plurality kinds of elements simultaneously on a substrate by using a liquid.

The method comprises the following steps. First, a plurality of kinds of elements having different shapes are prepared. For example, when three kinds of elements are disposed, circular, triangular, and quadrangular elements are prepared. The plurality of kinds of elements are dispersed in a liquid to prepare a dispersion liquid.

A substrate having recesses having identical shapes to these of respective elements is prepared. The substrate is subjected to the dispersion liquid to dispose the plurality of kinds of elements on the substrate.

Patent Literature 3 (United States Patent Pre-Grant Publication No. 2006/0057293) also discloses a method for disposing a plurality of kinds of elements on a substrate by using a liquid.

The method comprises the following steps. First, a plurality of kinds of elements having identical shapes are prepared. A substrate having a plurality of recesses where the elements are to be disposed is prepared. A lower portion of the respective recesses has a heater.

Next, the substrate is immersed in a liquid. The viscosity of the liquid is increased by heat. The heater heats the lower portion of the recess. This increases the viscosity of the liquid in the neighborhood of the recess.

Subsequently, first elements are dispersed in the liquid. The first elements are not disposed on the recesses covered by the liquid having high viscosity. On the contrary, the first elements are disposed on the recesses which are not heated.

Next, the first elements are removed from the liquid, and the heater is turned off. This decreases the viscosity of the liquid in the neighborhood of the recesses. Furthermore, second elements are dispersed in the liquid to dispose the second elements on the recesses on which the first elements has not been disposed. Optionally, these procedures may be repeated. Thus, the elements are disposed on the recesses of the substrate.

SUMMARY OF THE INVENTION

According to the prior methods for disposing the elements by using a liquid, the probability of disposing the elements on the recesses becomes lower when the elements is more downsized. The reason is described below.

The elements are disposed on the recesses by the gravity. On the contrary, the dispersion liquid gives force by turbulence, laminar flow, or convection (hereinafter referred to as "force of the dispersion liquid") to the elements. The amplitude of the gravity is proportional to the volume of the element, while the amplitude of the force of the dispersion liquid is proportional to the surface area of the element. When the element is more downsized, the amplitude of the force of the dispersion liquid becomes greater than the amplitude of the gravity.

Accordingly, even when the elements are disposed on the recesses by the gravity, the elements may be removed from the recesses easily by the force of the dispersion liquid. This causes the probability to be lowered.

The purpose of the present disclosure is to provide a method for disposing microstructures such as electric elements on the recesses of the substrate accurately and with high probability.

A first aspect of the present disclosure is a method of disposing a first microstructure and a second microstructure onto a first substrate, the method comprising steps of:

a step (A) of preparing the first substrate comprising an insulator, wherein:

the first substrate comprises a surface with a first recess and a second recess, the first recess includes a side wall and a bottom which are water-repellent, the second recess includes a side wall and a bottom which are water-repellent, the bottom of the second recess comprises a first electrode, the insulator is interposed between the bottom of the second recess and the first electrode, a portion of the surface of the first substrate other than the first recess and the second recess is hydrophilic;

a step (B) of immersing the first substrate into a electrolyte solution;

a step (C) of inserting a second electrode into the electrolyte solution;

a step (D) of injecting a bubble into the electrolyte solution with applying a voltage between the first electrode and the second electrode to dispose the bubble onto the first recess without disposing the bubble onto the second recess;

a step (E) of dispersing the first microstructure comprising a first hydrophilic surface and a first water-repellent surface into the electrolyte solution in a state where the surface of the first substrate is faced upwardly to dispose the first microstructure onto the first recess in a state where the first water-repellent surface is faced downwardly;

a step (F) of injecting the bubble into the electrolyte solution to dispose the bubble onto the second recess; and a step (G) of dispersing the second microstructure comprising a second hydrophilic surface and a second water-repellent surface into the electrolyte solution in a state where the surface of the first substrate is faced upwardly to dispose the second microstructure onto the second recess in a state where the second water-repellent surface is faced downwardly.

A second aspect of the present disclosure is a method of disposing a microstructure onto a first substrate, the method comprising steps of:

a step (A) of preparing the first substrate comprising an insulator on the surface thereof, wherein:
  the first substrate comprises a surface with a recess,
  the recess includes a side wall and a bottom which are water-repellent,
  a portion of the surface of the first substrate other than the recess is hydrophilic;

a step (B) of immersing the first substrate into a electrolyte solution;

a step (C) of injecting a bubble into the electrolyte solution to dispose the bubble onto the recess; and a step (D) of dispersing a microstructure comprising a hydrophilic surface and a water-repellent surface into the electrolyte solution in a state where the surface of the first substrate is faced upwardly to dispose the microstructure on the recess in a state where the water-repellant surface faces downwardly.

In the present invention, air bubbles are disposed on the recesses of the substrate, and the microstructures having a water-repellant surface are adhered to the air bubbles. This achieves that the microstructures are disposed on the recesses accurately and with high probability. Furthermore, because the air bubbles are disposed selectively on the recesses, a plurality of kinds of the microstructures are disposed on the substrate.

BRIEF DESCRIPTION OF THE DRAWINGS

FIGS. 1A to 1D show a method for disposing the microstructures according to the embodiment 1.

FIGS. 8A to 8C show a method for disposing the microstructures according to the embodiment 4.

FIGS. 9A to 9F show a method for preparing the substrate 301 according to the example 1.

DETAILED DESCRIPTION OF THE INVENTION

The embodiments of the present invention are described with reference to the drawings. Hatching lines may be omitted to promote an understandings.

(Embodiment 1)

In the embodiment 1, a method for disposing two kinds of microstructures on a substrate is described.

A method according to the embodiment 1 comprises a preliminary step of preparing microstructures and preparing a substrate comprising recesses, and steps 1-9 of disposing the microstructures in the recesses selectively.

FIG. 1A to FIG. 1D, FIG. 2A to FIG. 2C, and FIG. 3A to FIG. 3D show a method for disposing two kinds of microstructures onto a substrate. FIGS. 4A to 4D show the two kinds of structures. FIGS. 5A and 5B show the substrate.

(Preliminary Step)

Figure 4A:
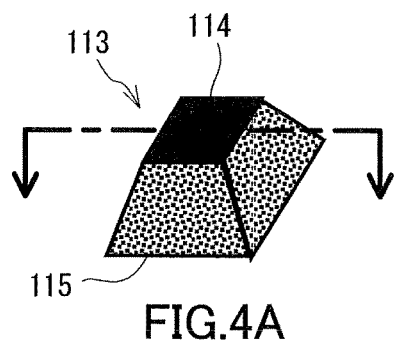
FIGS. 4A and 4B show the first microstructure 113.
Figure 4C:
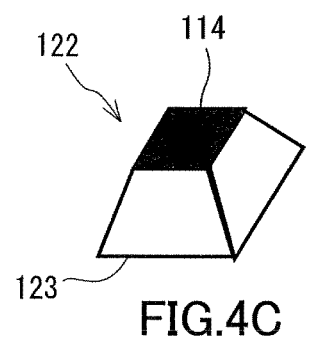
FIGS. 4C and 4D show the second microstructure 122.
Figure 4B:
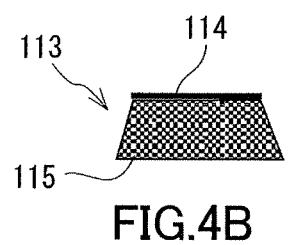
Figure 4D:
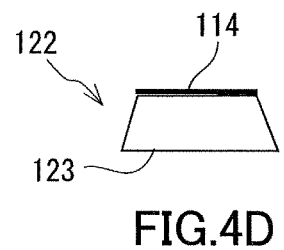
Figure 5A:
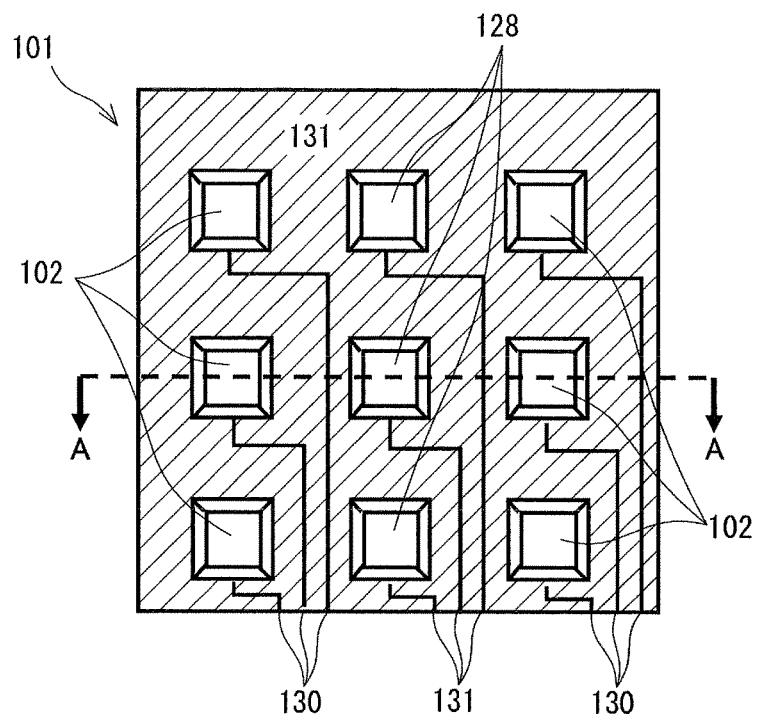
FIGS. 5A and 5B show the substrate 101 in the embodiment 1.
Figure 5B:
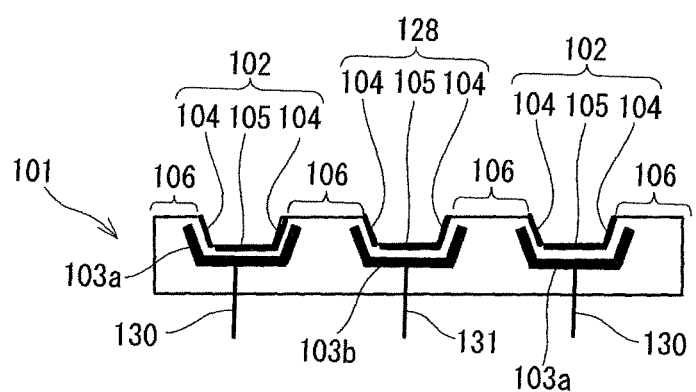

FIG. 4A and FIG. 4C show perspective views of a first microstructure and a second microstructure, respectively. FIG. 4B and FIG. 4D show cross sectional views of A-A in FIG. 4A and FIG. 4C, respectively.

The first microstructure 113 comprises a first water-repellant surface 114 and a first hydrophilic surface 115. Similarly, the second microstructure 122 comprises a second water-repellant surface 124 and a second hydrophilic surface 123. In FIG. 4A to FIG. 4D, both of the first microstructure 113 and the second micro structure 122 have trapezoidal shapes. However, these shapes are not limited to. These shapes may be cubic, rectangular parallelepiped, or disk-shaped.

Examples of the materials of the water-repellant surfaces are silicon and alkyl fluoride group such as $CF_3(CF_2)_m$—(m is a natural number). Examples of the materials of the hydrophilic surfaces are silicon oxide, GaAs, and GaN.

"Water-repellant" means that a static contact angle of a droplet of pure water is not less than 90 degrees. "Hydrophilic" means that the static contact angle is less than 90 degree.

FIG. 5A shows a plane view of the substrate. FIG. 5B shows a cross-sectional view of A-A in FIG. 5A.

A first substrate 101 comprises an insulator on the surface thereof. In FIG. 5A, and FIG. 5B, the first substrate 101 consists of an insulator. The first substrate 101 comprises a first recess 102 and a second recess 128 on the obverse surface thereof. Each of the recesses 102/128 comprises a side surface 104 and a bottom surface 105.

The bottom surface 105 of the first recess 102 comprises a first electrode 103a. The first electrode 103a is covered with an insulator. Namely, the first electrode 103a is not exposed from the bottom surface 105 of the first recess 102. In other words, the first electrode 103a is provided inside the substrate 101. The first electrode 103a may be provided on the reverse surface of the substrate 101.

The bottom surface 105 of the second recess 128 comprises a second electrode 103b. The second electrode 103b is covered with an insulator. Namely, the second electrode 103b is not exposed from the bottom surface 105 of the second recess 128. In other words, the second electrode 103b is provided inside the substrate 101. The second electrode 103b may be provided on the reverse surface of the substrate 101.

A first electric line 130 and a second electric line 131 are provided for the first electrode 103a and the second electrode 103b, respectively. Both of the side surface 104 and the bottom surface 105 are water-repellant. An obverse region 106 of the first substrate 101 except for the recesses is hydrophilic.

Examples of the first substrate 101 are the following (1) to (4):

(1) A glass substrate, a silicon nitride substrate, or a silicon substrate with the oxidized surface;

(2) A substrate having an insulator film such as silicon oxide or silicon nitride formed on the surface of the metal plate;

(3) A resin substrate having a hydrophilic surface such as a nylon resin substrate, a polycarbonate resin substrate, a polymethylmetacrylate resin substrate; or (4) A polyimide resin substrate having the hydrophilic surface formed by oxygen plasma treatment.

A typical example of the method for preparing the substrate 101 is described below. First, a substrate having a hydrophilic surface is prepared. A recess is formed on the surface of the substrate by etching or machine work.

The electrode and the electric wire are formed at the side surface and the bottom surface of the recess by a photolithography method or a printing method. Subsequently, a thin insulation film is formed on the substrate entirely. The substrate is immersed in an organic solution containing a silane coupling agent having fluorocarbon group ($CF_3(CF_2)_n$; n is a natural number or zero) or hydrocarbon group ($CH_3(CH_2)_n$; n is a natural number or zero).

Subsequently, the substrate is drawn up from the organic solution to bind the silane coupling agent having a fluorocarbon chain or hydrocarbon chain to the surface of the substrate. Thus, the entirety of the surface of the substrate becomes water-repellant.

Subsequently, the recesses are covered with a glass mask or a metal mask, and the recesses are irradiated with an ultraviolet light. Due to disappearance of the silane coupling agent, the region that has been irradiated with the ultraviolet light becomes hydrophilic. On the contrary, the surfaces of the recesses covered with the mask remain to be water-repellant. Thus, the substrate 101 comprising the water-repellant side surface 104, the water-repellant bottom surface 105, and the hydrophilic region 106 is obtained.

(Step 1)

As shown in FIG. 1A, the obtained first substrate 101 is immersed in an electrolyte solution 181. A vessel 107 contains the electrolyte solution 181. An example of the electrolyte solution 181 is an aqueous solution containing an inorganic salt or an organic solution containing an organic salt. It is preferable that the electrolyte solution 181 have high surface tension. An aqueous solution dissolving an inorganic salt such as NaCl, KCl, or $NaCO_3$ is preferred. It is preferable that the inorganic salt has a concentration of 1 mmol/liter to 1 mol/liter.

(Step 2)

As shown in FIG. 1B, a third electrode 109 is inserted into the electrolyte solution 181. A direct voltage 108 is applied between the third electrode 109 and the second electrode 103b of the second recess 128. Due to electro wetting phenomenon, the side surface 104 and the bottom surface 105 of the second recess 128 become hydrophilic.

(Step 3)

As shown in FIG. 1C, air bubbles 111 are injected into the electrolyte solution 181 from a syringe 110. The air bubbles 111 are disposed only on the first recess 102, which is water-repellant. The air bubbles 111 are not disposed on the hydrophilic region 106, and the second recess 128 which are hydrophilic due to electro wetting phenomenon. FIG. 1C shows how the air bubbles 112 are disposed only on the first recess 102.

The reason why the air bubbles 112 are disposed only on the first recess 102, which is water-repellant, is that the free energy of the entire system including the electrolyte solution 181, the first substrate 101, and the air bubbles 111 is decreased due to the decrease of the interface energy between the air bubbles/the electrolyte solution and between the water-repellant region/the liquid.

(Step 4)

As shown in FIG. 1D, the first microstructures 113 are dispersed in the electrolyte solution 181. The first substrate 101 faces upwardly.

Particularly, a dispersion liquid in which the first microstructures 113 are dispersed is supplied to the electrolyte solution 181. When the first microstructures 113 are dispersed in the electrolyte solution 181, the first microstructures 113 are adsorbed to the air bubbles 112 in a state where the first water-repellant surface 114 faces downwardly. Thus, the first microstructures 113 are disposed on the first recess 102. FIG. 1D shows how the first microstructures 113 are adsorbed to the air bubbles 112.

The reason why the first microstructures 113 are adsorbed to the air bubbles 112 as described above is identical to the reason why the air bubbles 111 are disposed only on the water-repellant surface of the first recess 102 in the step 3.

Unfavorably, as shown in FIG. 1D, the first microstructures 113 may be disposed on the second recess 128 due to the gravity. A referential numeral 117 indicates the first microstructures disposed on the second recess 128 by the gravity. Optionally, the following step 5 is performed to remove the first microstructures 117 from the second recess 128.

(Step 5)

Figure 2A:
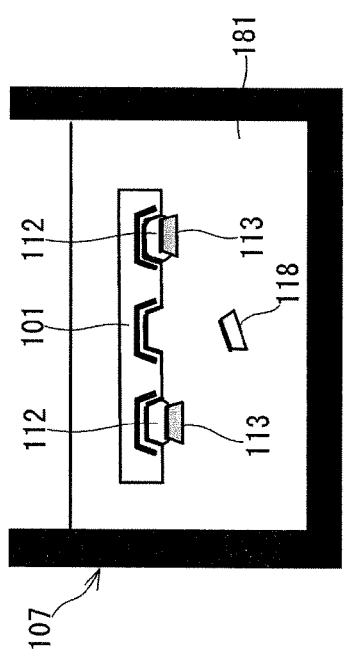
FIGS. 2A to 2C show a method for disposing the microstructures according to the embodiment 1.

As shown in FIG. 2A, the substrate 101 is turned over. So the microstructure 117 disposed on the second recess 128 falls by the gravity. A referential numeral 118 indicates the microstructure which has fallen. On the contrary, the microstructures 113 adsorb to the air bubbles 112 and do not fall, because the attractive force between the air bubble 112 and the microstructure 113 is greater than the gravity of the first microstructure 113.

(Step 6)

In the step 6, the steps 2-4 and the optional step 5 are repeated to dispose other structures on the recesses.

Figure 2B:
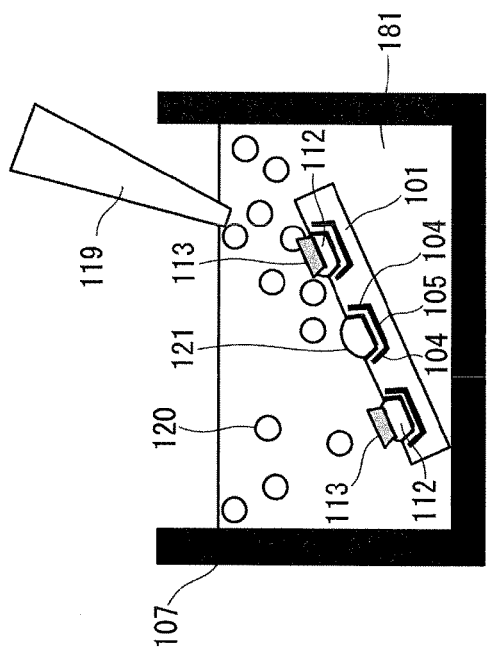

As shown in FIG. 2B, air bubbles 120 are injected into the electrolyte solution 181 with a syringe 119. Because the side surface 104 and the bottom surface 105 of the second recess 128 are water-repellant, the air bubbles 120 are disposed on the side surface 104 and the bottom surface 105 of the second recess 128. Because the surface of the microstructure 113 which is in contact with the electrolyte solution 181 is hydrophilic, the air bubbles are not disposed on the surface. FIG. 2B shows how the air bubbles 121 are disposed only on the second recess 128. After the voltage application is stopped, the second recess 128 is returned to be water-repellant. Only during the voltage application, the second recess 128 is converted to be hydrophilic due to electro wetting phenomenon. When the voltage is not applied, the second recess 128 is water-repellant. In the step 6, no voltage is applied between the second electrode 103b and the third electrode 109.

Figure 2C:
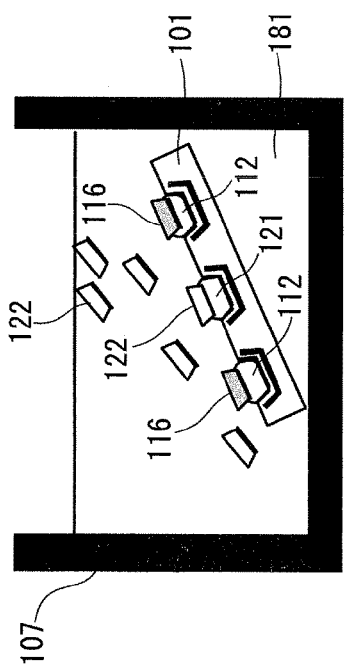

Next, as shown in FIG. 2C, in a similar manner to the step 4, the second microstructures 122 are dispersed in the electrolyte solution 181. This causes the second microstructures 122 to be adsorbed to the air bubbles 121. FIG. 2C shows how the second microstructures 122 are adsorbed to the air bubbles 121.

(Step 7)

Figure 3A:
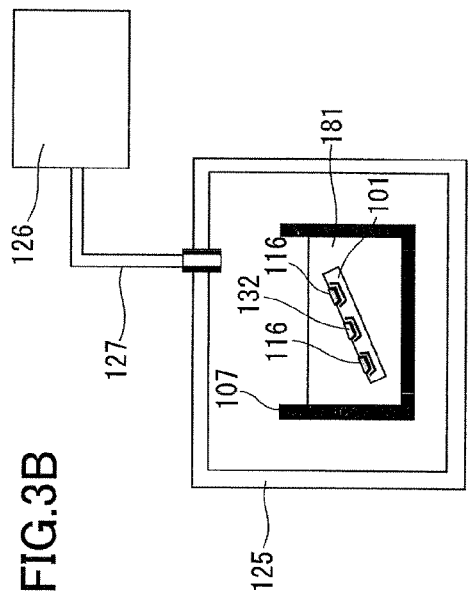
FIGS. 3A to 3D show a method for disposing the microstructures according to the embodiment 1.

As shown in FIG. 3A, the vessel 107 is put in a pressure tight case 125. The pressure tight case 125 is connected to a pressure adjustment device 126 through a tube 127.

The pressure adjustment device 126 supplies high-pressure air to the pressure tight case 125. The high-pressure air is supplied to the pressure tight case 125 through the tube 127 to adjust the pressure in the pressure tight case 125 to more than 1 atmospheric pressure and not more than 100 atmospheric pressures.

Figure 3B:
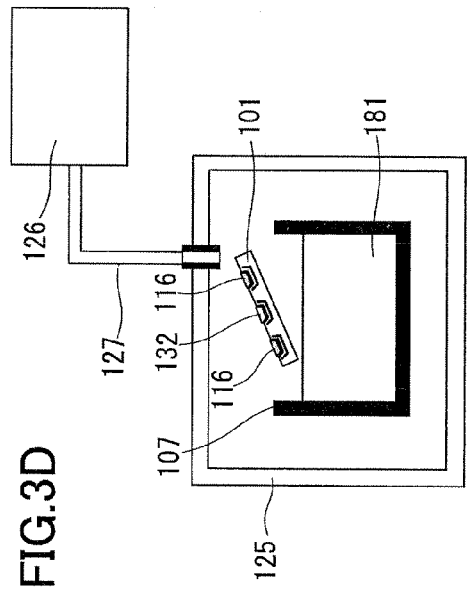

Next, as shown in FIG. 3B, the pressure in the pressure tight case 125 increases with the pressure adjustment device 126. This causes the volumes of the air bubbles 112 and the air bubbles 121 to be decreased to dispose the first microstructure 113 and the second microstructure 122 onto the first recess 102 and the second recess 128, respectively.

(Step 8)

Figure 3C:
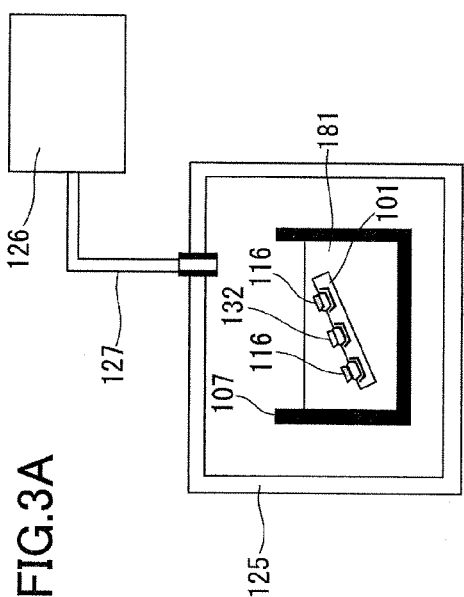

As shown in FIG. 3C, the first substrate 101 is drawn up slowly from the electrolyte solution 181.

(Step 9)

Figure 3D:
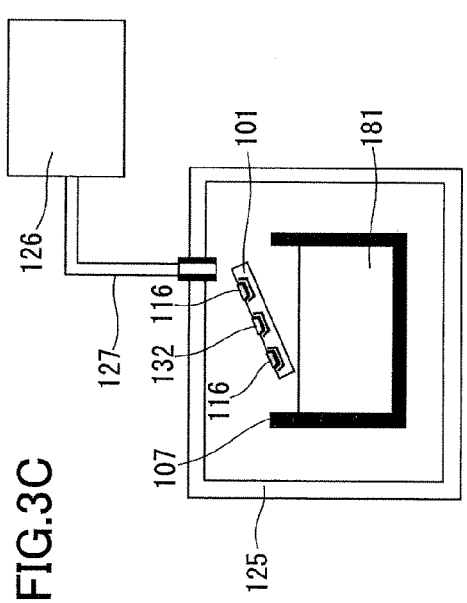

As shown in FIG. 3D, the pressure in the pressure tight case 125 is returned to 1 atm, which is equal to approximately $1.013 \times 10^5$ Pa in the international system of units, with the pressure adjustment device 126.

Through the steps 1-9, the first microstructure 113 and the second microstructure 122 are disposed on the first recess 102 and the second recess 128, respectively. The steps 7-9 are performed optionally.

(Embodiment 2)

The embodiment 2 comprises the steps shown in the FIG. 6A to FIG. 6D after the steps 1-6.

Figure 6B:
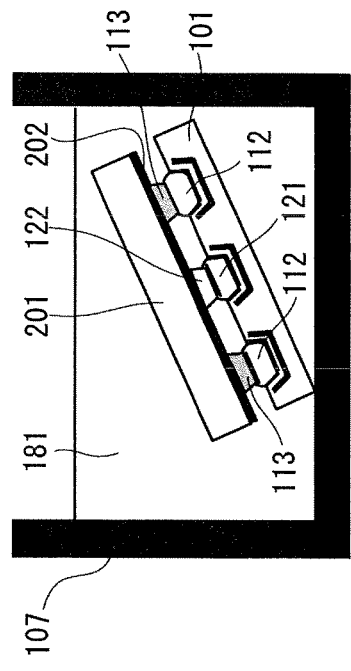
FIGS. 6A to 6D show a method for disposing the microstructures according to the embodiment 2.
Figure 6D:
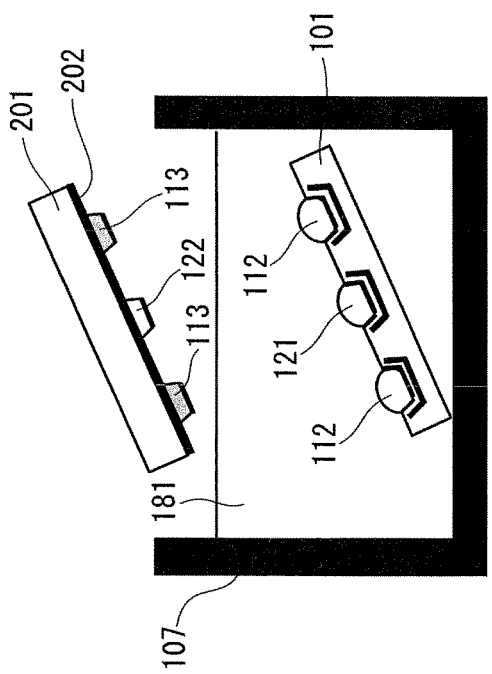
Figure 6A:
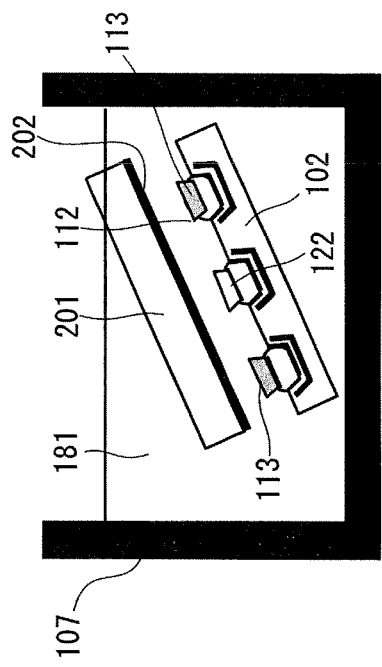

As shown in FIG. 6A, after step 6, a second substrate 201 is immersed in the electrolyte solution 181. The surface of the second substrate 201 comprises an adhesive film 202.

The material of the film 202 is not limited to as long as it has the adhesivity to the microstructure. Examples of the film 202 are a resin which polymerizes by heat or a light-curing resin. The material of the film 202 is applied by a spin coat method, a dipping method, or a blade coat method to form the adhesive film 202.

Figure 6C:
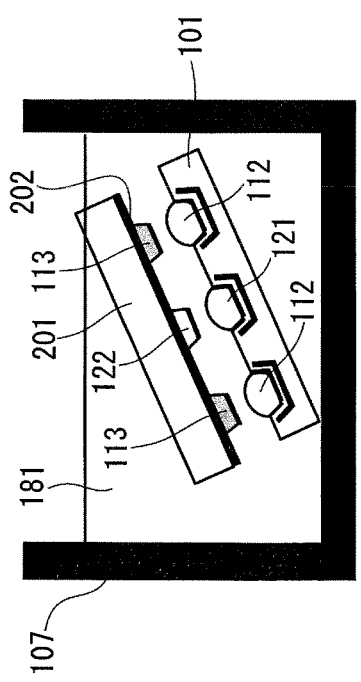

Next, as shown in FIG. 6B, the second substrate 201 is contacted to the first substrate 101. The first microstructure 113 and the second microstructure 122 are adhered to the film 202. As shown in FIG. 6C, the second substrate 201 is detached from the first substrate 101 to transcribe the first microstructure 113 and the second microstructure 122 to the adhesive film 202.

Finally, as shown in FIG. 6D, the second substrate 201 is drawn up from the electrolyte solution 181.

Thus, the first microstructure 113 and the second microstructure 122 are disposed on the second substrate 201.

(Embodiment 3)

In the embodiment 3, an n-channel transistor and a p-channel transistor are disposed selectively on a substrate.

Figure 7A:
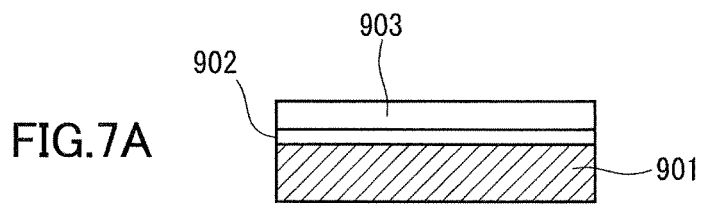
FIGS. 7A to 7F show a method for disposing the microstructures according to the embodiment 3.

FIG. 7A to FIG. 7F show a method for preparing the n-channel transistor disposed according to the embodiment 3. As shown in FIG. 7A, a silicon substrate 901 is prepared. The surface of the silicon substrate 901 has a thermally-oxidized film 902 and a p-type silicon thin film 903. The p-type silicon film 903 is a channel layer through which electrons flow.

Figure 7B:
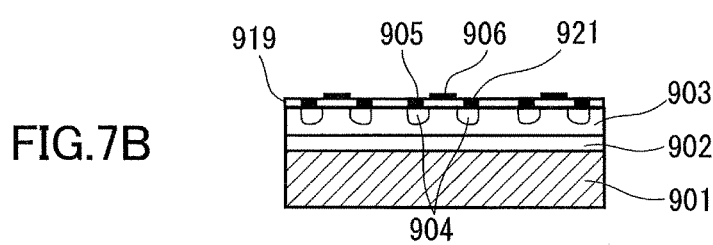

As shown in FIG. 7B, an n-channel transistor is formed by an ordinal semiconductor process. The n-channel transistor comprises a gate insulator 919 consisting of silicon oxide, an n-type region 904, a source electrode 905, a drain electrode 921, and a gate electrode 906. The forefront surfaces of the source electrode 905, the drain electrode 921, and the gate electrode 906 may be composed of a gold film.

Figure 7C:
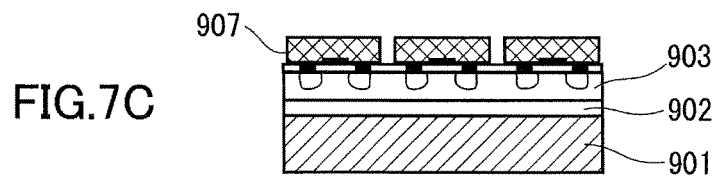

As shown in FIG. 7C, each of the n-channel transistors is covered with a resist film 907.

Figure 7D:
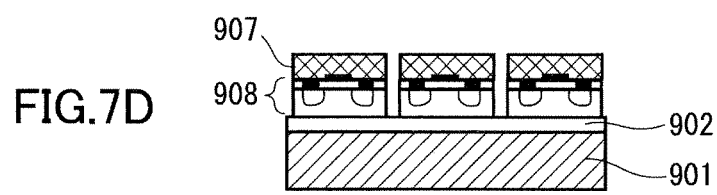

As shown in FIG. 7D, the p-type silicon thin film 903 is dry-etched to obtain n-channel transistor elements 908.

Figure 7E:
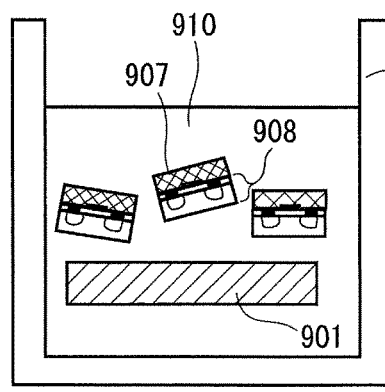

As shown in FIG. 7E, the substrate 901 is immersed in an ammonium fluoride aqueous solution 910 to etch the thermally-oxidized film 902. Thus, the n-channel transistor elements 908 are dispersed in the ammonium fluoride aqueous solution 910.

The aqueous solution in which the n-channel transistor elements 908 are dispersed is filtrated with a Teflon (Registered Trade Mark) filter to capture the n-channel transistors elements 908 on the Teflon (Registered Trade Mark) filter (not shown).

Figure 7F:
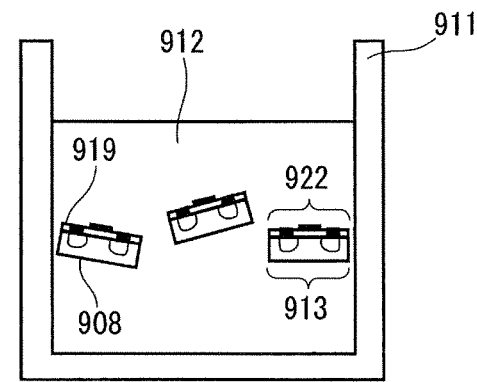

As shown in FIG. 7F, the Teflon (Registered Trade Mark) filter is immersed in an organic solvent 912 such as acetone to disperse the n-channel transistor elements 908. Thus, the resist film 907 is removed.

Finally, the organic solvent 912 containing the n-channel transistor elements 908 is filtrated with a Teflon (Registered Trade Mark) filter to capture the n-channel transistor elements 908 on the Teflon (Registered Trade Mark) filter. The Teflon (Registered Trade Mark) filter is immersed in a liquid such as methanol or ethanol to disperse the n-channel transistor elements 908 (not shown). Thus, the dispersion liquid containing the n-channel transistor elements 908 is prepared.

Because an oxide film is absent in the reverse surface 913 of the n-channel transistor elements 908, the reverse surface 913 is water-repellant. On the contrary, because the obverse surface 922 of the n-channel transistor elements 908 comprises the exposed insulation film 919 and the gold electrodes, the obverse surface 922 is hydrophilic.

A dispersion liquid containing the p-channel transistor element is prepared in a similar manner to the above description.

The n-channel transistor elements and the p-channel transistor elements prepared according to the above description are disposed selectively on the surface according to the embodiment 1 as the first microstructure 113 and the second microstructure 122, respectively.

After these transistor elements are disposed on the substrate, these transistor elements are connected electrically by a photolithography process. Thus, a switching circuit and an oscillator circuit are formed on the substrate.

(Embodiment 4)

In the embodiment 4, an n-channel transistor and a p-channel transistor are disposed selectively on the second substrate.

Through the steps shown in FIG. 7A to FIG. 7D, the n-channel transistor elements 908 are obtained. As shown in FIG. 8A, the water-repellant film 914 is formed on the resist film 907 on the surface of the n-channel transistor elements 908 to obtain a laminate composed of the n-channel transistor element 908, the resist film 907, and the water-repellant film 914.

An example of a method for forming the water-repellant film 914 is described below.

The substrate 901 having the resist film 907 is put into a vacuum spattering device to subject the substrate 901 to plasma. Tetrafluoroethylene resin is spattered by argon plasma to form the water-repellant film 914 on the surface of the substrate 901. It is preferable that a thickness of the water-repellant film 914 is thin. Particularly, the thickness is approximately 2-3 nanometers. The water-repellant film 914 has a lot of pinholes.

Next, as shown in FIG. 8B, the substrate 901 is immersed in the ammonium fluoride aqueous solution 916. The ammonium fluoride aqueous solution 916 penetrates the pinholes to dissolve the thermal-oxidized film 902 by etching. As a result, the n-channel transistor elements 908 are dispersed in the ammonium fluoride aqueous solution 916.

The n-channel transistor elements 908 dissolved in the ammonium fluoride aqueous solution 916 is filtrated with the Teflon (Registered Trade Mark) filter to capture the n-channel transistor elements 908 on the Teflon (Registered Trade Mark) filter.

As shown in FIG. 8C, the Teflon (Registered Trade Mark) filter is immersed in a hydrogen peroxide aqueous solution 918 to disperse the n-channel transistor elements 908. Thus, the forefront surface 920 of the p-type silicon thin film becomes hydrophilic by oxidization.

The hydrogen peroxide aqueous solution 918 containing the n-channel transistor elements 908 is filtrated with a Teflon (Registered Trade Mark) filter to capture the n-channel transistor elements 908 on the Teflon (Registered Trade Mark) filter.

Finally, the Teflon (Registered Trade Mark) filter is immersed in a liquid to disperse the n-channel transistor elements 908. Preferably, the liquid which does not solve the resist film 907 is selected. Particularly, an aqueous solution or alcohol having long chain alkyl group such as hexanol or heptanol is preferred.

The obtained n-channel transistor elements 908 and the p-channel transistor elements are disposed selectively on the substrate in a similar manner to the embodiment 2 as the first microstructures 113 and the second microstructures 122, respectively. These transistors are disposed in a state where the forefront surface 920 of the silicon thin film faces a substrate for transcription. Subsequently, the substrate for transcription is immersed in an organic solvent such as acetone.

EXAMPLE 1

In the example 1, disk-shaped structures with a diameter of 100 micrometers and a thickness of 3 micrometers were disposed selectively on the recesses of the substrate. The procedure is described below.

(1. Preparation of a Substrate)

Figure 10A:
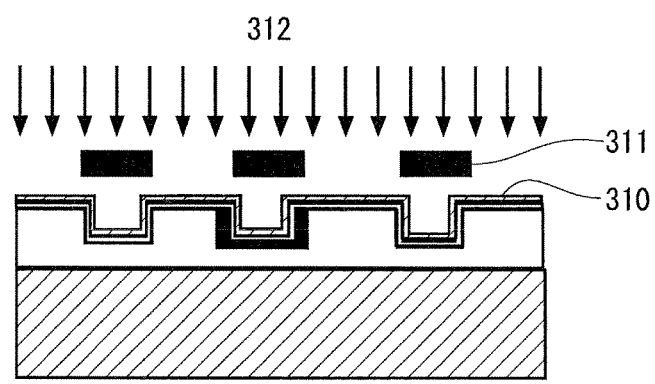
FIGS. 10A and 10B show a method for preparing the substrate 301 according to the example 1.
Figure 10B:
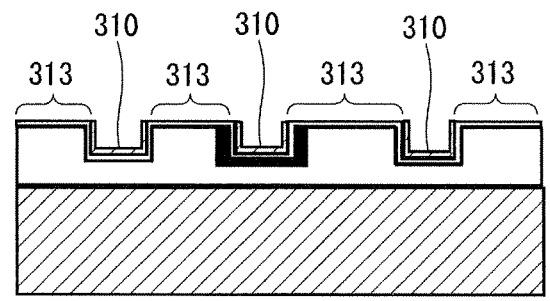

A method for preparing the substrate is described with reference to FIG. 9A to FIG. 9F, FIG. 10A and FIG. 10B. In FIG. 9A to FIG. 9F, the upper drawings show top schematic views, the lower drawings show cross-sectional schematic views. FIG. 10A and FIG. 10B show cross-sectional schematic views.

As shown in FIG. 9A, first, the substrate 301 consisting of a silicon wafer having a diameter of four inches and a thickness of five hundreds micrometers was prepared.

As shown in FIG. 9B, silicon oxide film 302 having a thickness of five micrometers was formed on the substrate 301 with a vacuum plasma CVD method.

As shown in FIG. 9C, the silicon oxide film 302 was etched by a dry etching method to form two kinds of recesses having different diameters. The first recess 303 had a diameter of 110 micrometers and a depth of 4 micrometers. The second recess 304 had a diameter of 111 micrometers and a depth of 4 micrometers.

Although nine recesses are illustrated in FIG. 9C, the substrate 301 actually comprised 50 first recesses 303 and 50 second recesses 304. The recesses 303 and 304 were arranged to have center-to-center distances of 500 micrometers. The recesses 303 and 304 were arrayed in the form of a grid having 10 columns and 10 rows.

In FIG. 9C, the upper-lower direction on the paper denotes the longitudinal direction of the substrate, and the left-right direction on the paper denotes the lateral direction of the substrate. As shown in FIG. 9C, one column of the same kind of recesses was arrayed along the longitudinal direction. And a column consisting of the first recesses 303 and a column consisting of the second recesses 304 are disposed alternately.

As shown in FIG. 9D, an electrode 305 consisting of platinum with a film thickness of 200 nanometers was formed. The electrode 305 comprised a linear region 307 having a short side of 120 micrometers and a square region 308 having 10 millimeters×10 millimeters. The linear region 307 covered the bottom surface and side surface of the second recesses 304.

A method for preparing the electrode 305 is described below.

First, the region other than the second recesses 304 was covered with a positive resist film by photolithography. Next, a platinum thin film having a film thickness of 200 nanometers was formed on the surface of the substrate 301 by a vacuum spattering method. Subsequently, the positive resist film was removed to form a platinum electrode 305 shown in FIG. 9D.

As shown in FIG. 9E, a silicon nitride film 309 with a film thickness of 800 nanometers was formed by plasma CVD method. The shape of the silicon nitride film 309 was a square having one side with a length of 55 millimeters.

The silicon nitride film 309 covered all of the first recesses 303, all of the second recesses 304, and the region 307. The region 308 was not covered.

A method for preparing the silicon nitride film 309 is described particularly below. A square metal mask having one side with a length of 200 millimeters was prepared. The center of the metal mask comprised a square through-hole having one side with a length of 55 millimeters. And the metal mask was adhered on the substrate 301 in such a manner that all of the first recesses 303, all of the second recesses 304, and the region 307 fell within the square through-hole. Furthermore, the substrate was put into a plasma CVD device to form the silicon nitride film 309 on the surface of the substrate 301.

As shown in FIG. 9F, a water-repellant film 310 was formed on the entire surface of the substrate 301. A procedure of forming the water-repellant film 310 is described below.

The substrate 301 was immersed for one hour in a mixed solution of n-hexadecane and chloroform (volume ratio 4:1) containing $CF_3(CF_2)_7C_2H_4SiCl_3$ at a concentration of 1 vol. %. Subsequently, the substrate 301 was washed with chloroform with swing.

Figure 11:
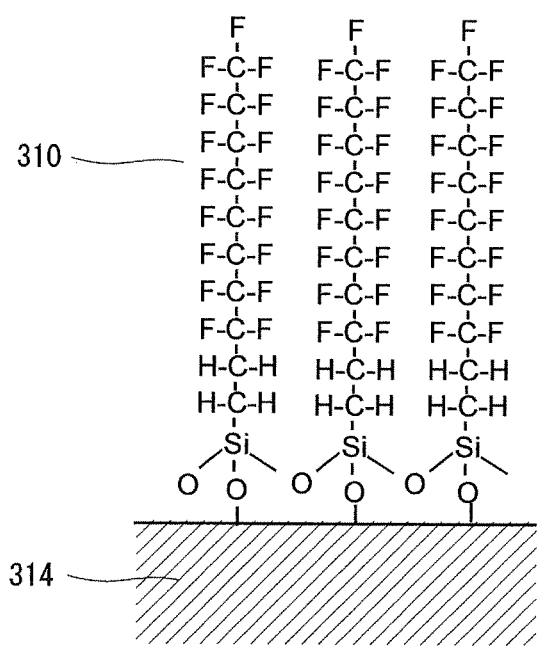
FIG. 11 shows the water-repellant film 310 on the substrate 301 in the example 1.

FIG. 11 shows a schematic view of the water-repellant film 310 formed on the substrate surface 314. The water-repellant film 310 is a monomolecular film. Instead of this, the water-repellant film 310 may be a polymer or a mixture of a polymer and a monomolecular film. The polymer has a structure where two molecules of $CF_3(CH_2)_7C_2H_4Si$ are bound to each other through oxygen.

Next, as shown in FIG. 10A, ultraviolet light 312 was irradiated on the water-repellant film other than the first recesses 303 and the second recesses 304 with a photomask 311. The light source of the ultraviolet light 312 was a low-pressure mercury lamp having main wavelengths of 185 nanometers and 254 nanometers.

As a result, as shown in FIG. 10B, the water-repellant film 310 was removed only from the region 313 where the ultraviolet light 312 was irradiated. As described above, through the steps of FIG. 9A to FIG. 9F, FIG. 10A and FIG. 10B, the substrate was formed.

(2. Preparation of Microstructures)

FIG. 12A to FIG. 12F show a method for preparing microstructures.

Figure 12A:
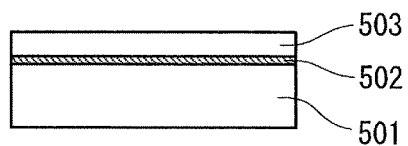
FIGS. 12A to 12F show a method for preparing the microstructures 510 according to the example 1.

As shown in FIG. 12A, an aluminum thin film 502 with a film thickness of 100 nanometers was formed by an EB vapor deposition method on the silicon wafer 501 having a diameter of 6 inches and a thickness of 500 micrometers. Next, a silicon oxide film 503 with a thickness of 3 micrometers was formed by a plasma CVD method.

Figure 12B:
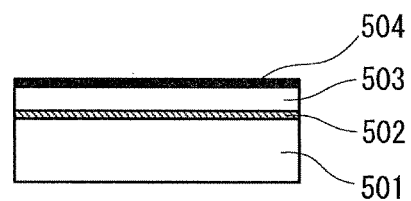

As shown in FIG. 12B, a titanium thin film with a thickness of 10 nanometers and a metal film 504 with a thickness of 100 nanometers were formed on the silicon oxide film 503 by an EB deposition method in this order.

Figure 12C:
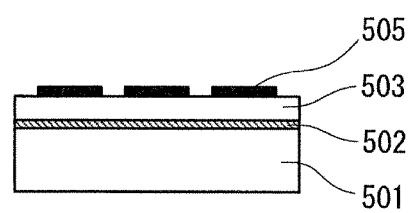

As shown in FIG. 12C, the metal film 504 was etched by a photolithography method to form an metal pattern 505. Particularly, a pattern of the positive resist film having an identical shape to the pattern of the gold to be formed was formed by the photolithography. Subsequently, the silicon wafer 501 was immersed in a gold etchant and a titanium etchant in this order. The gold etchant was an aqueous solution where iodine and potassium iodide were dissolved. The titanium etchant was an aqueous solution where hydrofluoric acid and nitric acid were dissolved. Subsequently, the resist film was removed.

Figure 12D:
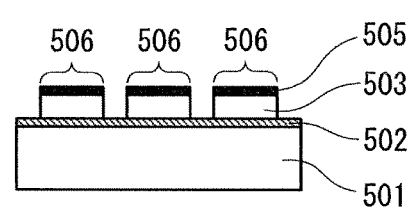

As shown in FIG. 12D, the silicon oxide film 503 was patterned by a dry-etching method. Particularly, the positive resist pattern having an identical shape to that of the silicon oxide 506 was formed by the photolithography. Subsequently, the silicon oxide film 503 was dry-etched with $CF_4$ gas. Finally, the resist film was removed.

Figure 12E:
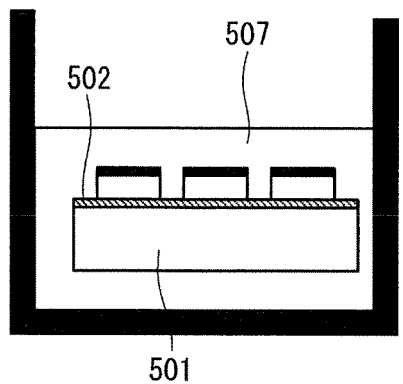
Figure 12F:
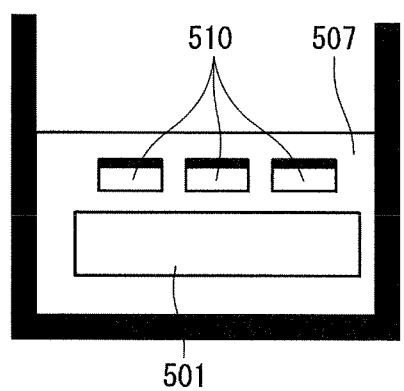

As shown in FIG. 12E and FIG. 12F, the substrate 501 was immersed in an aluminum etchant 507 at a temperature of 70 degree Celsius to etch the aluminum thin film 502. The aluminum etchant 507 was a mixture of 76 wt % phosphoric acid, 4 wt % nitric acid, 15 wt % acetic acid, and 5 wt % water.

Thus, the microstructures 510 were removed from the substrate 501 to disperse the microstructures 510 in the aluminum etchant 507.

The etchant containing the microstructures 510 was filtrated with a Teflon (Registered Trade Mark) filter to capture the microstructures 510 on the Teflon (Registered Trade Mark) filter. Subsequently, the Teflon (Registered Trade Mark) filter was immersed in ethanol containing 1 vol % $CF_3(CF_2)_7C_2H_4SH$ to disperse the microstructures 510 in the ethanol. The ethanol was left overnight. Thus, a water-repellant film was formed on the metal pattern 505 of the microstructures 510.

Next, the ethanol containing the microstructures 510 was filtrated with a Teflon (Registered Trade Mark) filter to capture the microstructures 510 on the Teflon (Registered Trade Mark) filter. Finally, the Teflon (Registered Trade Mark) filter was immersed in methanol to disperse the microstructure 510 in the methanol. Methanol was added to adjust the concentration of the methanol in such a manner than approximately 2,000,000 microstructures 510 were dispersed in 10 milliliters of methanol.

Figures 13A, 13B:
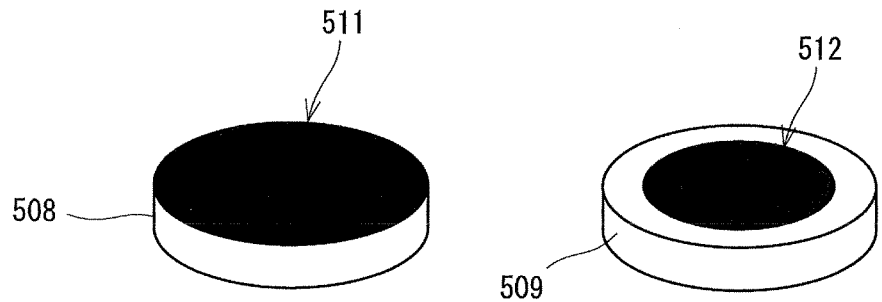
FIGS. 13A to 13C show the first microstructures 508, the second microstructures 509, and the water-repellant film 513 on the substrate in the example 1.

FIG. 13A and FIG. 13B show the first microstructure 508 and the second microstructure 509 prepared according to the example 1, respectively. Both of the first microstructure 508 and the second microstructure 509 had a disk shape with a diameter of 100 micrometers and a thickness of 3 micrometers.

Figure 13C:
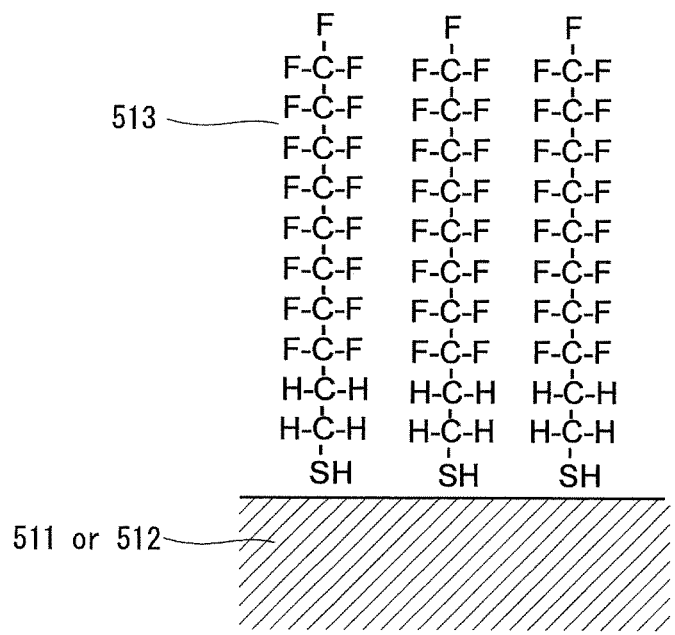

The surface of the first microstructure 508 comprised a metal pattern 511 with a diameter of 100 micrometers, while the surface of the second microstructure 509 comprised a metal pattern 512 with a diameter of 80 micrometers. Water-repellant films 513 were formed on both of the metal patterns 511/512. FIG. 13C shows the water-repellant films 513 formed on the metal patterns 511/512.

(3. Method for Disposing the Microstructures on the Substrate)

Figure 14C:
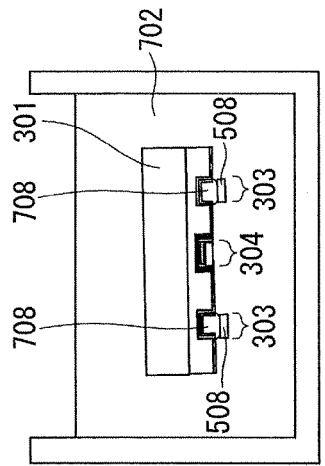
FIGS. 14A to 14F show a method for disposing the microstructures according to the example 1.
Figure 14F:
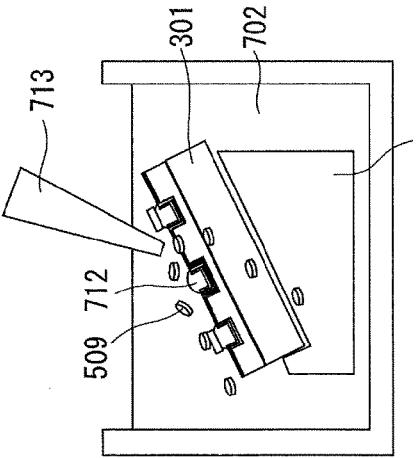
Figure 14B:
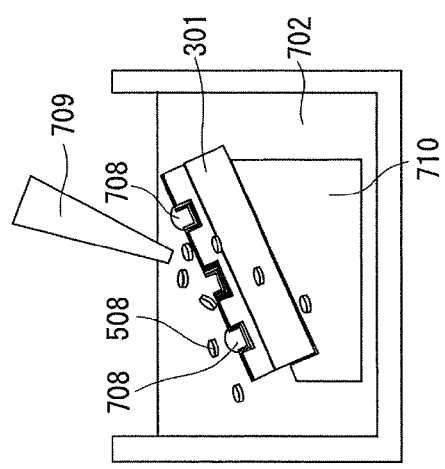
Figure 14E:
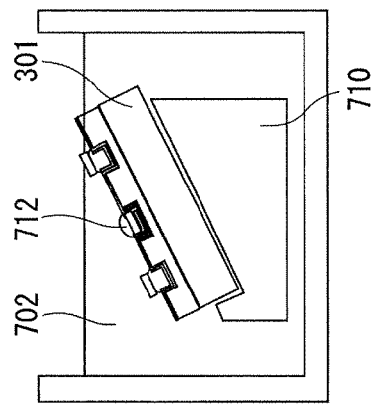
Figure 14A:
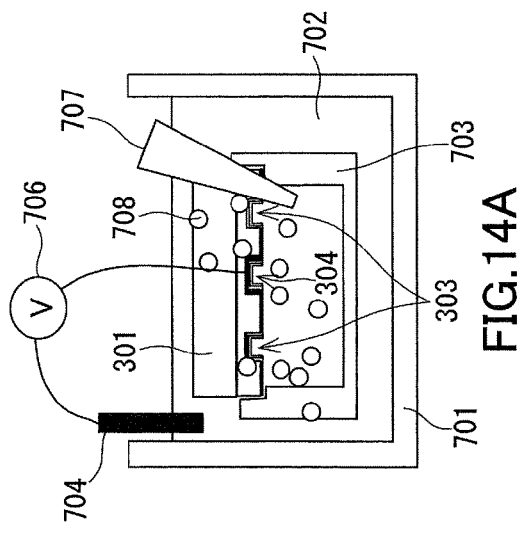

FIG. 14A to FIG. 14F show a method for disposing air bubbles on the recesses 303 of the substrate 301. As shown in FIG. 14A, the substrate 301 was fitted with a first jig 703 in the vessel 701 containing a liquid 702. The first recess 303 and the second recess 304 were set downwardly.

The vessel 701 was a glass vessel with 20 centimeters long×20 centimeters wide×40 centimeters deep.

The liquid 702 was an electrolyte solution in which 0.1 mol/liter of KCl was dissolved. A voltage of DC 30 V was applied between the electrode 305 formed on the bottom of the second recess 304 and a third electrode 704 immersed in the electrolyte solution 702. Positive voltage and negative voltage were applied to the electrode 305 and the third electrode 704, respectively.

After the voltage was applied, air bubbles 708 were injected from a syringe 707 to dispose the air bubbles 708 on the first recesses 303 of the substrate 301.

The syringe 707 was a glass tube. The glass tube had a length of 15 centimeters, and the pore diameters of the both of the ends of the glass tube were different. The pore diameter of the one end was 30 micrometers, and the pore diameter of the other end was approximately 10 micrometers. A gum tube was fitted with the other end to inject compressed air from the pore having the inner diameter of 30 micrometers to the liquid 702 through the glass tube.

Figures 16A, 16B:
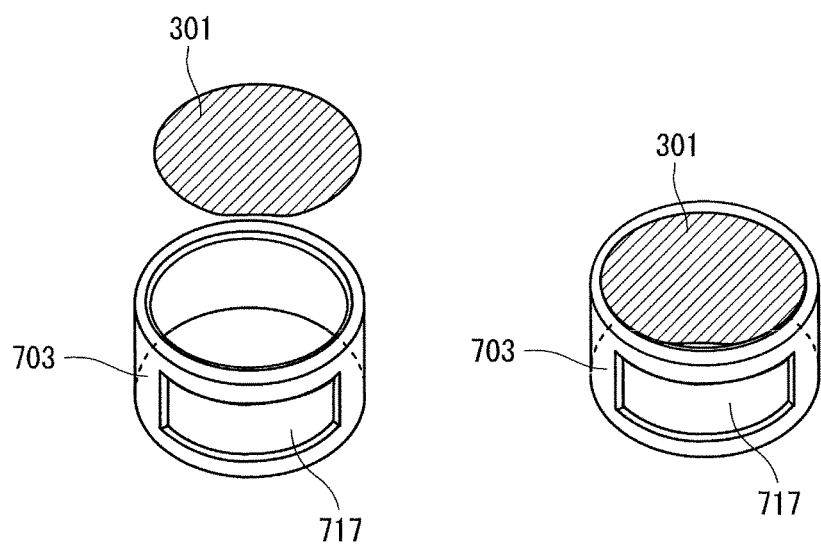
FIGS. 16A and 16B show the first jig 703.

FIG. 16A shows a schematic view of the first jig 703 before the substrate 301 is fixed. FIG. 16B shows a schematic view of the first jig 703 after the substrate 301 is fixed.

The first jig 703 comprised a window 717. The tip of the syringe 707 was inserted into the window 717 to have the air bubbles 708 reach the substrate 301.

After the air bubbles 708 were disposed, the application of the voltage was stopped, and the first jig 703 was drawn up from the electrolyte solution 702.

FIG. 14B shows a method for disposing the microstructure 508 to the first recess 303. As shown in FIG. 14B, after the air bubbles 708 were disposed on the substrate 301, a second jig 710 was immersed in the liquid 702 and the substrate 301 was fixed to the second jig 710. The first microstructures 508 dispersed in the methanol were injected to the electrolyte solution 702. The number of the injected first microstructures 508 was approximately 50,000. The syringe 709 was a Pasteur pipette with a volume of 1 ml.

As shown in FIG. 14C, the substrate 301 was turned over in such a manner that the first recesses 303 and the second recesses 304 faced downwardly.

Figure 14D:
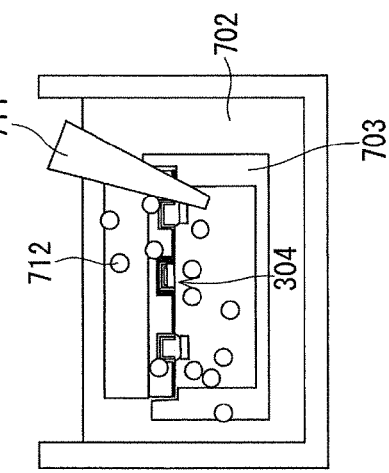

As shown in FIG. 14D and FIG. 14E, except that the voltage failed to be applied, the air bubbles 712 were disposed on the second recesses 304 in a similar manner to FIG. 14A to fix the substrate 301 to the second jig 710.

As shown in FIG. 14F, the second microstructures 509 were injected into the electrolyte solution 702 in a similar manner to FIG. 14B.

Figure 15C:
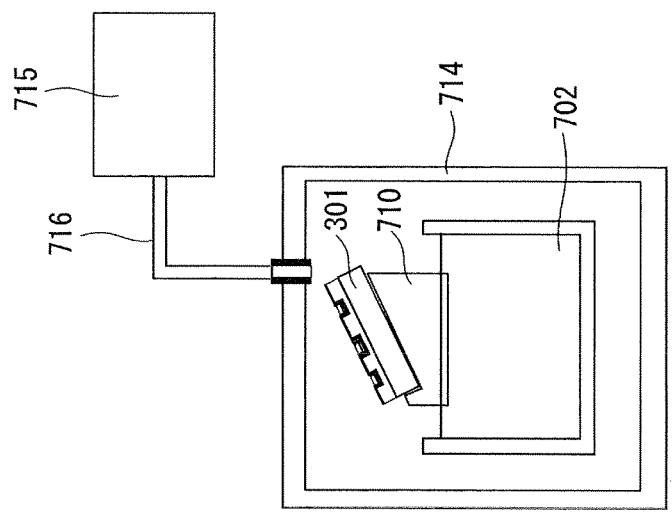
FIGS. 15A to 15C show a method for disposing the microstructures according to the example 1.
Figure 15B:
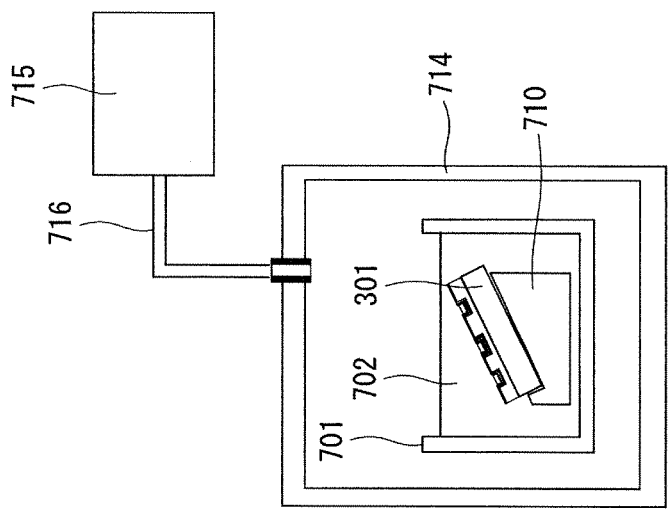
Figure 15A:
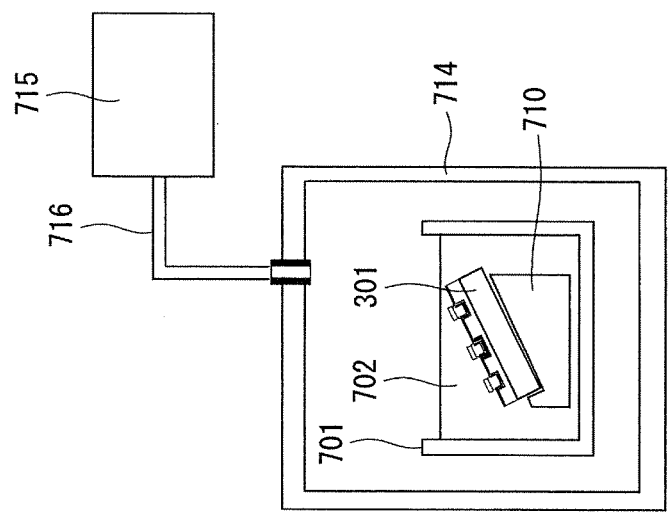

As shown in FIG. 15A, the vessel 701 was put into the pressure tight case 714. Subsequently, the pressure tight case 714 and a pressure adjustment device 715 were connected through a tube 716.

As shown in FIG. 15B, compressed air was flowed from the pressure adjustment device 715 to the pressure tight case 714 to set the pressure inside the pressure tight case 714 to be 10 atmospheric pressures. This decreased the volume of the air bubbles 712 disposed on the first recesses 303 and the second recesses 304 to dispose the first microstructures 508 and the second microstructures 509 on the first recesses 303 and the second recesses 304, respectively.

Finally, as shown in FIG. 15C, the second jig 710 was drawn up vertically to draw the substrate 301 from the electrolyte solution 702. Subsequently, the pressure in the pressure tight case 714 was returned to an atmospheric pressure with the pressure adjustment device 715. Thus, the first microstructures 508 and the second microstructures 509 were disposed on the substrate 301.

(Evaluation Method and Results)

The numbers of the first microstructure 508 and the second microstructure 509 disposed respectively on the first recesses 303 and the second recesses 304 were examined with an optical microscope. It was also examined which side of the obverse side or the reverse side each of the disposed first microstructures 508 and the disposed second microstructure 509 faces. Table 1 shows the results.

TABLE 1

|  | The number of structures disposed on the first recesses 303 (The number of the structures where the metal patterns 511/512 having the water-repellant film 513 face the substrate) | The number of structures disposed on the second recesses 303 (The number of the structures where the metal patterns 511/512 having the water-repellant film 513 face the substrate) |
|---|---|---|
| First microstructures 508 | 43(43) | 0 |
| Second microstructures 509 | 5(5) | 43(43) |

As understood from Table 1, the first microstructures 508 and the second microstructures 509 were disposed respectively on the first recesses 303 and the second recesses 304 in such a manner that the metal patterns 511/512 having the water-repellant film 513 face the substrate. Almost all of the first microstructures 508 and almost all of the second microstructures 509 were disposed selectively on the first recesses 303 and the second recesses 304, respectively.

In principle, according to the present disclosure, the first microstructures 508 and the second microstructures 509 are disposed on the first recesses 303 and the second recesses 304, respectively. The metal patterns 511/512 face the substrate.

The probabilities Pa and Pb that the microstructures are disposed respectively on the first recesses 303 and the second recesses 304 were calculated.

Pa: a value obtained by dividing the number of the first microstructures 508 disposed on the first recesses 303 with each of the metal surface facing the substrate by fifty.

Pb: a value obtained by dividing the number of the second microstructures 509 disposed on the second recesses 304 with each of the metal surface facing the substrate by fifty.

When the first microstructures 508 and the second microstructures 509 are disposed respectively on the first recesses 303 and the second recesses 304 more accurately, the values of the Pa and the Pb become greater. The values of the Pa and the Pb calculated from Table 1 are 0.86, respectively.

COMPARATIVE EXAMPLE 1

In the comparative example 1, the first microstructures 508 were disposed on the first recesses 303 of the substrate 301 in a similar manner disclosed in Patent Literature 1.

The substrate was obtained through the steps shown in FIG. 9A to FIG. 9C. The steps of FIG. 9D to FIG. 9F, FIG. 10A and FIG. 10B were not performed. The microstructures 508 were prepared according to the procedure shown in FIG. 12 except that the water-repellant water was not formed.

According to the procedure shown in FIG. 14B, the first microstructures 508 were disposed on the first recesses 303. However, the steps shown in FIG. 14A and FIG. 14C to FIG. 14F were not performed. The liquid 702 was pure water. The number of the first microstructures 508 supplied to the liquid 702 was approximately 100,000. After the first microstructures 508 were disposed, the substrate 301 was drawn up from the liquid 702.

The surface of the substrate 301 was observed with an optical microscope to examine the number of the first microstructures 508 disposed on the first recesses 303. The present inventor also examined which side of the obverse surface or the reverse surface the first microstructures 508 faced. Table 2 shows the result.

TABLE 2

| The number of the first microstructure 508 disposed on the first recesses 303 | The number of the first microstructures 508 with the metal surface facing the substrate |
|---|---|
| 10 | 5 |

In the comparative example 1, the first microstructures 508 are disposed on the first recesses 508 without the differentiation of the obverse and reverse surface.

The probability that the microstructures 508 are disposed on the first recesses 303 was defined as the value obtained by dividing the number of the microstructures 508 disposed on the first recesses 303 by the sum (100) of the number of the first recesses 303. When the microstructures 508 are disposed on the first recesses 303 more accurately, the probability becomes greater. The probability calculated from Table 2 was 0.1.

The probabilities of both of the Pa and the Pb in the example 1 are greater than the above-mentioned probability (0.1). This means that the present method is superior to the prior method.

EXAMPLE 2

The first microstructures 508 and the second microstructures 509 were disposed respectively on the first recesses 303 and the second recesses 304 in a similar manner to FIG. 14A to FIG. 14F except that the following steps were performed instead of the steps through FIG. 15A to FIG. 15C.

A mixed solution containing 85 wt % of dodecylmethacrylate, 14.5 wt % of triethyleneglycoldimethacrylate, and 0.5 wt % of benzoylperoxide was spin-coated to form an thermosetting resin on the surface of an glass plate.

After the step in FIG. 14F, the glass plate was adhered to the substrate 301 to transcribe the first microstructures 508 and the second microstructures 509 to the glass plate. The glass plate had a diameter of 100 millimeters and a thickness of 1 millimeter.

Subsequently, the glass plate was drawn up from the liquid 702. Finally, the glass plate was heated at 100 degree Celsius for ten minutes to fix the first microstructures 508 and the second microstructures 509 to the glass plate. As described above, the first microstructures 508 and the second microstructures 509 were disposed on the glass plate.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

Industrial Applicability

The present invention allows electric microelements to be disposed accurately with high probability. The present invention is useful for mounting electric components which constitute an electric device such as a small portable device, a display, and a solar cell.

What is claimed is:

1. A method of disposing a first microstructure and a second microstructure onto a first substrate, the method comprising steps of:
   a step (A) of preparing the first substrate, wherein:
      the first substrate comprises a surface with a first recess and a second recess,
      the first recess includes a side wall and a bottom which are water-repellent,
      the second recess includes a water-repellent insulator film and a first electrode,
      the first electrode is formed on a bottom and a side wall of the second recess, and is not formed in the first recess,
      a bottom and a side of the first electrode are covered with a bottom and a side of the water repellant insulator film, respectively, in such a manner that the bottom and the side of the water repellant insulator film are exposed in the inside of the second recess,
      a portion of the surface of the first substrate other than the first recess and the second recess is hydrophilic;
   a step (B) of immersing the first substrate into a electrolyte solution;
   a step (C) of inserting a second electrode into the electrolyte solution;
   a step (D) of injecting a bubble into the electrolyte solution with temporarily converting the water repellant insulator film to a hydrophilic film by applying a voltage between the first electrode and the second electrode, so as to dispose the bubble onto the first recess, which is water repellant, without disposing the bubble onto the second recess, which has been temporarily converted to hydrophilic by applying the voltage;
   a step (E) of dispersing the first microstructure comprising a first hydrophilic surface and a first water-repellent surface into the electrolyte solution in a state where the surface of the first substrate is faced upwardly to dispose the first microstructure onto the first recess in a state where the first water-repellent surface is faced downwardly;
   a step (F) of injecting the bubble into the electrolyte solution to dispose the bubble onto the second recess without applying voltage between the first electrode and the second electrode; and
   a step (G) of dispersing the second microstructure comprising a second hydrophilic surface and a second water-repellent surface into the electrolyte solution in a state where the surface of the first substrate is faced upwardly to dispose the second microstructure onto the second recess in a state where the second water-repellent surface is faced downwardly.

2. The method according to claim 1, further comprising a step of inverting the first substrate between the step (E) and the step (F).

3. The method according to claim 1, further comprising a step (H) of applying pressure onto the first substrate after the step (G).

4. The method according to claim 3, wherein the first substrate is left in a gaseous atmosphere with more than 101325 Pa in the step (H).

5. The method according to claim 1, further comprising a step of joining a second substrate onto the first substrate after the step (G).

* * * * *